(12) United States Patent
Chen et al.

(10) Patent No.: US 9,922,939 B2
(45) Date of Patent: Mar. 20, 2018

(54) WAFER LEVEL SHIELDING IN MULTI-STACKED FAN OUT PACKAGES AND METHODS OF FORMING SAME

(71) Applicant: Taiwan Semiconductor Manufacturing Company, Ltd., Hsinchu (TW)

(72) Inventors: Wei-Yu Chen, New Taipei (TW); Hsien-Wei Chen, Hsinchu (TW); An-Jhih Su, Taoyuan (TW); Jo-Mei Wang, New Taipei (TW); Tien-Chung Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/601,625

(22) Filed: May 22, 2017

(65) Prior Publication Data
US 2017/0256502 A1    Sep. 7, 2017

Related U.S. Application Data

(62) Division of application No. 14/918,311, filed on Oct. 20, 2015, now Pat. No. 9,659,878.

(51) Int. Cl.
*H01L 21/32* (2006.01)
*H01L 23/552* (2006.01)
(Continued)

(52) U.S. Cl.
CPC ........ *H01L 23/552* (2013.01); *H01L 21/3205* (2013.01); *H01L 21/565* (2013.01); *H01L 21/568* (2013.01); *H01L 21/6835* (2013.01); *H01L 21/76802* (2013.01); *H01L 21/76877* (2013.01); *H01L 21/78* (2013.01); *H01L 23/293* (2013.01); *H01L 23/3107* (2013.01); *H01L 23/481* (2013.01); *H01L 23/5389* (2013.01); *H01L 24/19* (2013.01); *H01L 24/20* (2013.01); *H01L 24/97* (2013.01); *H01L 25/0657* (2013.01); *H01L 25/50* (2013.01); *H01L 21/561* (2013.01); *H01L 24/32* (2013.01); *H01L 24/92* (2013.01); *H01L 2224/04105* (2013.01); *H01L 2224/12105* (2013.01); *H01L 2224/19* (2013.01); *H01L 2224/32225* (2013.01); *H01L 2224/73267* (2013.01);
(Continued)

(58) Field of Classification Search
None
See application file for complete search history.

(56) References Cited

U.S. PATENT DOCUMENTS 7,564,115 B2   7/2009  Chen et al.
7,633,165 B2   12/2009 Hsu et al.
(Continued)

*Primary Examiner* — Michael Lebentritt
(74) *Attorney, Agent, or Firm* — Slater Matsil, LLP

(57) ABSTRACT

An embodiment device package includes a device die, a molding compound surrounding the device die, a conductive through inter-via (TIV) extending through the molding compound, and an electromagnetic interference (EMI) shield disposed over and extending along sidewalls of the molding compound. The EMI shield contacts the conductive TIV, and the conductive TIV electrically connects the EMI shield to an external connector. The external connector and the EMI shield are disposed on opposing sides of the device die.

20 Claims, 16 Drawing Sheets

(51) Int. Cl.
  *H01L 21/3205* (2006.01)
  *H01L 21/56* (2006.01)
  *H01L 21/683* (2006.01)
  *H01L 21/768* (2006.01)
  *H01L 21/78* (2006.01)
  *H01L 23/29* (2006.01)
  *H01L 23/31* (2006.01)
  *H01L 23/48* (2006.01)
  *H01L 25/065* (2006.01)
  *H01L 25/00* (2006.01)
  *H01L 23/538* (2006.01)
  *H01L 23/00* (2006.01)

(52) U.S. Cl.
  CPC ............... *H01L 2224/92244* (2013.01); *H01L 2225/06548* (2013.01); *H01L 2924/18162* (2013.01); *H01L 2924/3025* (2013.01)

(56) References Cited

U.S. PATENT DOCUMENTS

| | | | |
|---|---|---|---|
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,872,312 B2 | 10/2014 | Wang et al. | |
| 9,437,576 B1 | 9/2016 | Yang et al. | |
| 9,461,001 B1 | 10/2016 | Tsai et al. | |
| 9,659,878 B2 * | 5/2017 | Chen | H01L 21/3205 |
| 2004/0222511 A1 | 11/2004 | Zhang | |
| 2010/0078778 A1 | 4/2010 | Barth et al. | |
| 2011/0115060 A1 | 5/2011 | Chiu et al. | |
| 2013/0082364 A1 | 4/2013 | Wang et al. | |
| 2014/0001645 A1 | 1/2014 | Lin et al. | |
| 2014/0225258 A1 | 8/2014 | Chiu et al. | |
| 2014/0252572 A1 | 9/2014 | Hou et al. | |
| 2015/0024547 A1 | 1/2015 | Wang et al. | |
| 2015/0279789 A1 | 10/2015 | Majajan et al. | |
| 2015/0303143 A1 | 10/2015 | Zhai et al. | |
| 2016/0090294 A1 | 3/2016 | Wachter et al. | |
| 2017/0005042 A1 | 1/2017 | Chen et al. | |

* cited by examiner

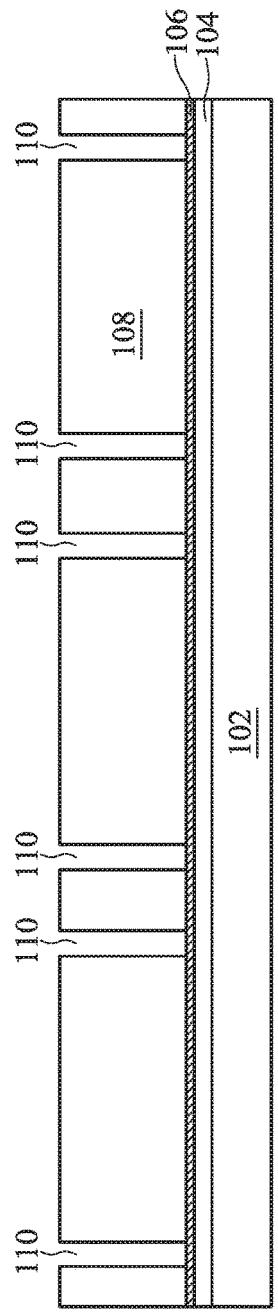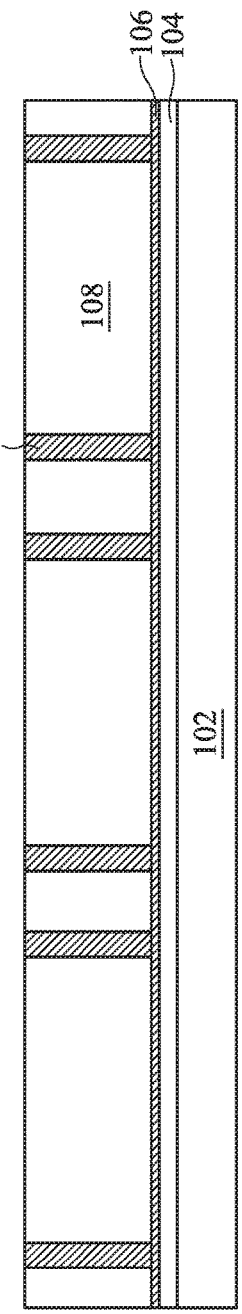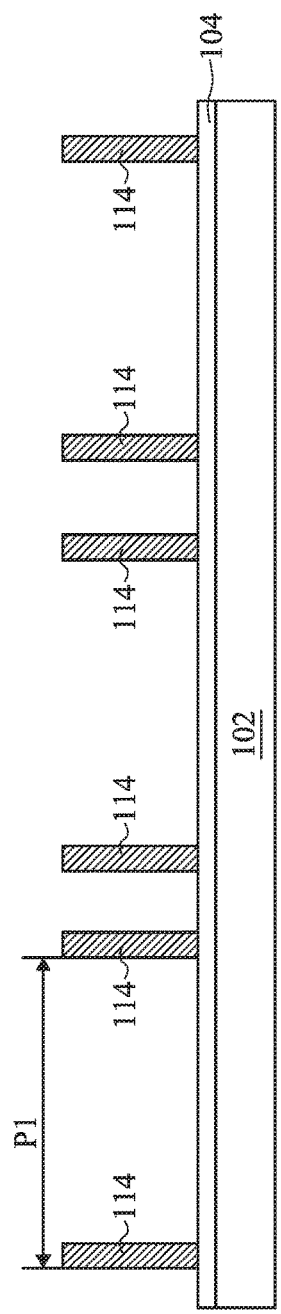

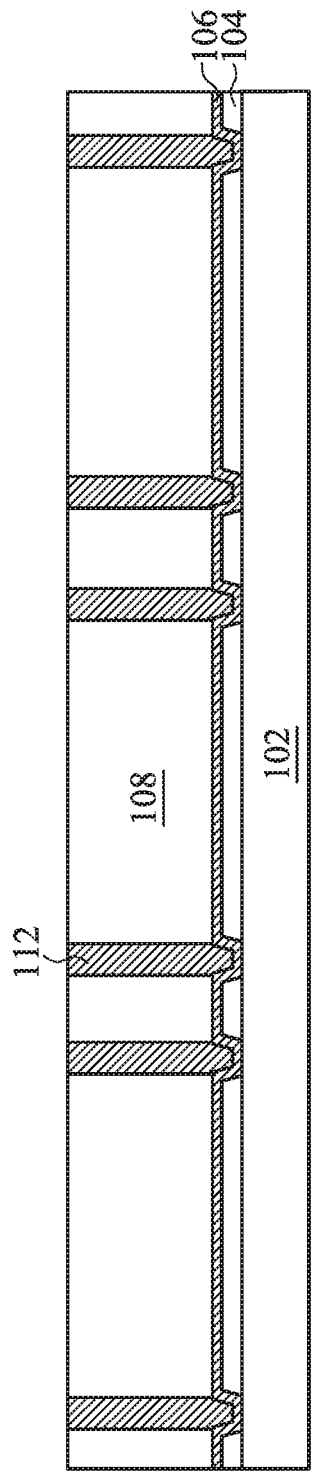
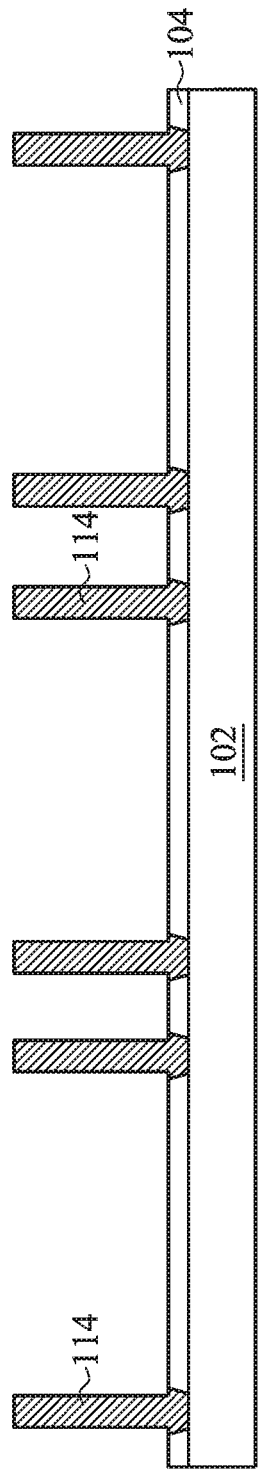

WAFER LEVEL SHIELDING IN MULTI-STACKED FAN OUT PACKAGES AND METHODS OF FORMING SAME

PRIORITY CLAIM AND CROSS-REFERENCE

This patent application is a divisional of U.S. application Ser. No. 14/918,311, filed on Oct. 20, 2015, which application is hereby incorporated by reference herein as if reproduced in its entirety.

BACKGROUND

In an aspect of conventional packaging technologies, such as multi-stacked fan-out packages, redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, a molding compound may be formed around the die to provide surface area to support the fan-out interconnect structures. For example, RDLs typically include one or more polymer layers formed over the die and molding compound. Conductive features (e.g., conductive lines and/or vias) are formed in the polymer layers and electrically connect I/O pads on the die to the external I/O pads over the RDLs. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 13B illustrate cross-sectional views of various intermediary stages of manufacturing a device package in accordance with some embodiments.

FIGS. 16 through 21 illustrate cross-sectional views of various intermediary stages of manufacturing a device package in accordance with some embodiments.

DETAILED DESCRIPTION

Figures 4, 5:
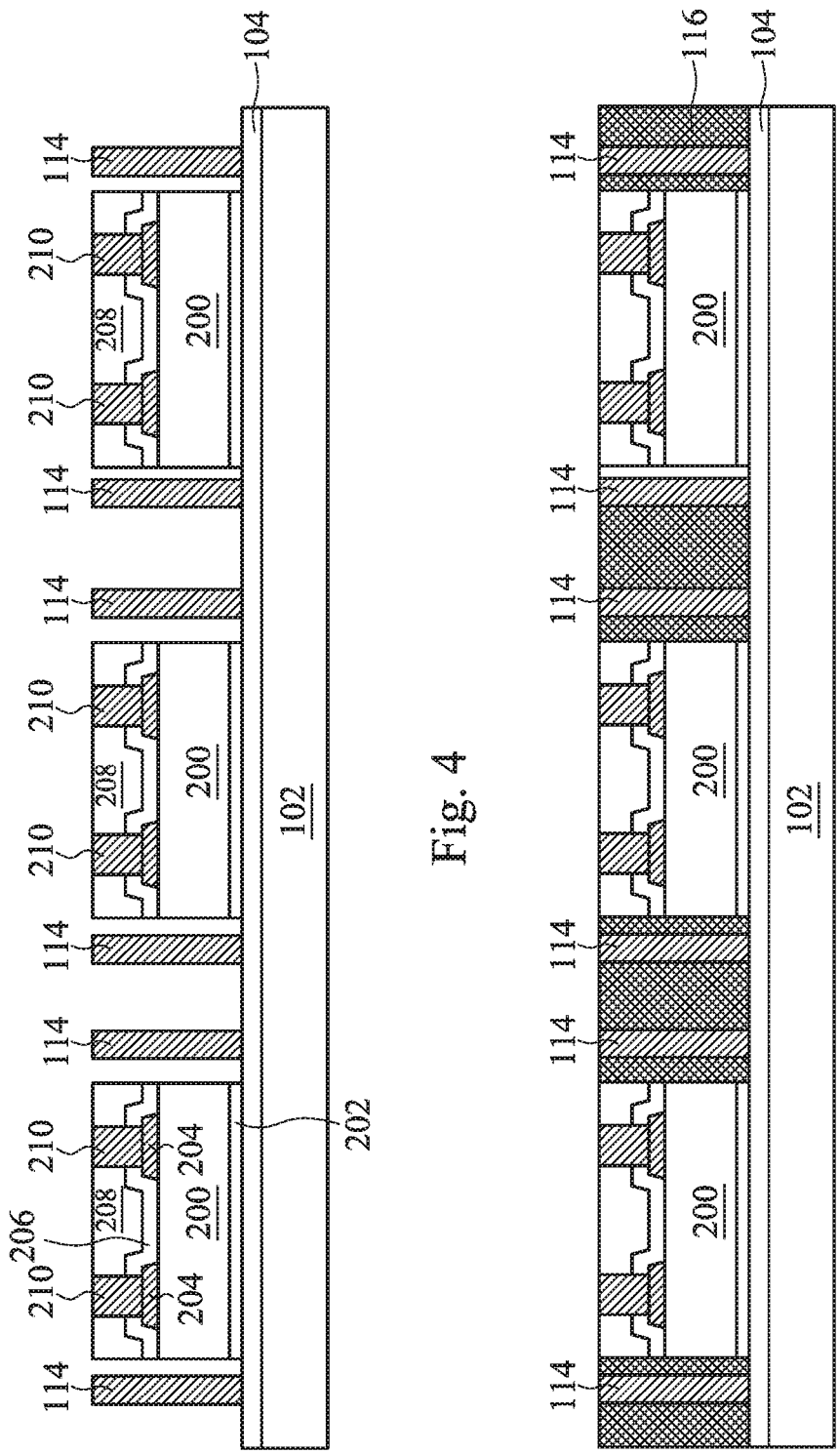

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a device package having multiple device dies (e.g., logic dies, memory dies, and the like) stacked in different package layers. Fan-out redistribution layers (RDLs) are disposed between the dies and provide electrical connections between the dies. Conductive through inter-vias (TIVs) may also be disposed in each package layer, and a combination of the fan-out RDLs and the TIVs provide electrical connections from a first side of the device package (e.g., a side having external connectors such as solder balls) to an opposing side of the device package. When an electromagnetic interference (EMI) shield is formed on the opposing side of the device package, the TIVs in each tier provide an electrical ground connection from the external connectors, through the device package, to EMI shield. Thus, a grounded EMI shield may be formed in a multi-layered device package.

FIGS. 1 through 13A illustrate cross-sectional views of various intermediary stages of manufacturing a device package 180 (see FIG. 13A) according to some embodiments. Referring first to FIG. 1, a carrier substrate 102 is illustrated. Generally, carrier substrate 102 provides temporary mechanical and structural support various features (e.g., device dies, see FIG. 4) during subsequent processing steps. In this manner, damage to the device dies is reduced or prevented. The carrier substrate 102 may comprise, for example, glass, silicon oxide, aluminum oxide, and the like.

Various layers may be formed over carrier substrate 102. For example, a polymer layer 104 may be formed over carrier substrate 102. Polymer layer 104 may comprise polybenzoxazole (PBO), for example, and polymer layer 104 in order to facilitate the removal of carrier substrate 102 from package wafer 100 in subsequent process steps (see e.g., FIG. 1YY). A seed layer 106 is formed over polymer layer 104, and seed layer 106 may comprises a conductive material, such as copper, which is formed by sputtering in an embodiment.

As further illustrated by FIG. 1, a patterned photoresist 108 is formed over seed layer 106. Photoresist 108 may be patterned to include openings 110 by exposing photoresist 108 to light (e.g., ultraviolet light) using a photomask (not shown). Exposed or unexposed portions of photoresist 108 may then be removed depending on whether a positive or negative resist is used to form openings 110. Openings 110 extend through photoresist 108 and expose portions of seed layer 106. Openings 110 may then be filled with a conductive material 112 (e.g., in an electro-chemical plating process, electroless plating process, and the like) as illustrated by FIG. 2. Subsequently, as illustrated in FIG. 3, photoresist 108 may be removed in an ashing and/or wet strip process, leaving TIVs 114 over carrier 102. Excess portions of seed layer 106 (e.g., portions of seed layer 106 not covered by TIVs 114) may also be removed using a combination of photolithograph and etching, for example. In the resulting structure, top surfaces of TIVs 114 may or may not be substantially level. In the completed device package 180 (see FIG. 13B), TIVs 114 are used to electrically connect an EMI shield formed over the package to ground. In some embodiments, TIVs 114 may have a pitch P1 of about 60 µm or greater. It has been observed that by providing TIVs having larger dimensions (e.g., in the range described above), improved grounding connections can be provided by TIVs 114 to a subsequently formed EMI shield (e.g., EMI shield 140, see FIG. 12). However, in other embodiments (e.g., embodiments where having a smaller form factor), smaller TIVs 114 may be formed as well.

Next, in FIG. 4, dies 200 are attached to a carrier substrate 102 for further processing. In an embodiment, an adhesive die attach film 202 is used to attach dies 200 to carrier substrate 102. The adhesive may be any suitable adhesive, such as an ultraviolet (UV) glue, or the like. Die 200 may be a semiconductor die and could be any type of integrated circuit, such as a processor, logic circuitry, memory, analog circuit, digital circuit, mixed signal, and the like. Die 200 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connects various active devices to form functional circuits within die 200. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

I/O and passivation features may be formed over the interconnect structure. For example, contact pads 204 may be formed over the interconnect structure and may be electrically connected to the active devices through the various conductive features in the interconnect structure. Contact pads 204 may comprise a conductive material such as aluminum, copper, and the like. Furthermore, a passivation layer 206 may be formed over the interconnect structure and the contact pads. In some embodiments, the passivation layer 206 may be formed of non-organic materials such as silicon oxide, undoped silicate glass, silicon oxynitride, and the like. Other suitable passivation materials may also be used. Portions of the passivation layer may cover edge portions of contact pads 204.

Additional interconnect features, such as additional passivation layers, conductive pillars, and/or under bump metallurgy (UBM) layers, may also be optionally formed over contact pads 204. For example, as illustrated by FIG. 4, conductive pillars 210 may be formed on and electrically connect to contact pads 204, and a dielectric layer 208 may be formed around such conductive pillars 210. The various features of dies 200 may be formed by any suitable method and are not described in further detail herein. Furthermore, the general features and configuration of dies 200 described above are but one example embodiment, and dies 200 may include any combination of any number of the above features as well as other features.

After dies 200 are attached to carrier substrate 102, a molding compound 116 may be formed around dies 200 and TIVs 114 as illustrated by FIG. 5. Molding compound 116 may include any suitable material such as an epoxy resin, phenol resin, a thermally-set resin, and the like. In addition to these materials, molding compound 116 may or may not include various additive fillers, such as silicon oxide, aluminum oxide, boron nitride, and the like. Suitable methods for forming molding compound 116 may include compressive molding, transfer molding, liquid encapsulent molding, and the like. For example, molding compound 116 is shaped or molded using a molding tool (not illustrated) which may have a border or other feature for retaining molding compound 116 when applied. The molding tool may be used to dispense molding compound 116 around dies 200/TIVs 114 to force molding compound 116 into openings and recesses, eliminating air pockets or the like. Molding compound 116 may be dispensed around dies 200 and TIVs 114 in liquid form. Subsequently, a curing process is performed to solidify molding compound 116.

Molding compound 116 may be formed to initially extend over and cover top surfaces of dies 200 and TIVs 114. Subsequently, a planarization process (e.g., a mechanical grinding, chemical mechanical polish (CMP), or other etch back technique) may be employed to remove excess portions of molding compound 116 over dies 200. After planarization, connectors (e.g., conductive pillars 210) of dies 200 are exposed, and top surfaces of molding compound 116, TIVs 114, and dies 200 may be substantially level. In a top down view of the resulting structure (not shown), molding compound 116 may encircle dies 200 and TIVs 114.

Figure 6:
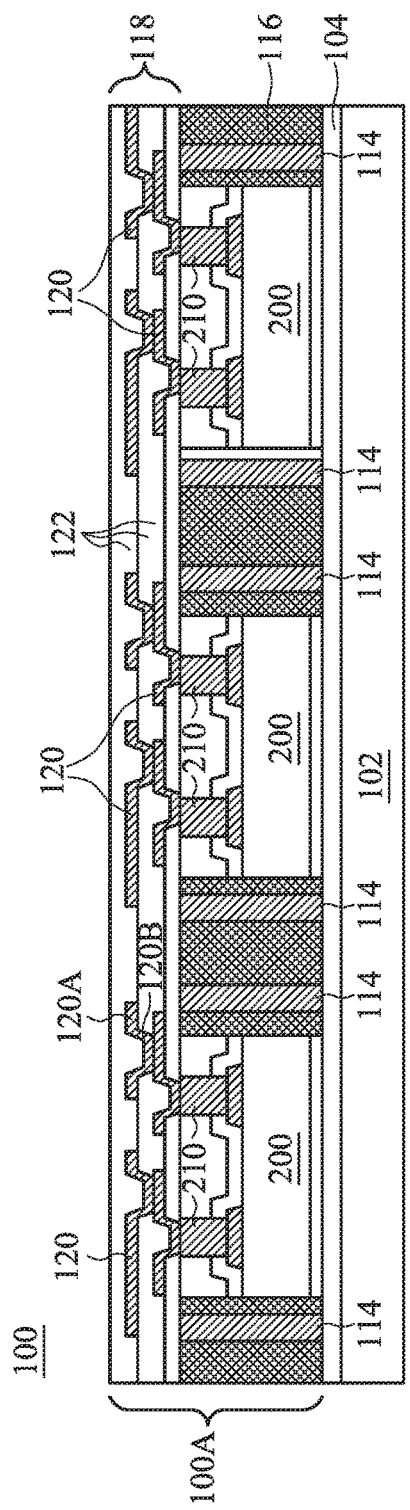

FIG. 6 illustrates the formation of RDLs 118 over molding compound 116, TIVs 114, and dies 200. RDLs 118 may extend laterally past edges of dies 200 over a top surface of molding compound 116. RDLs 118 may include conductive features 120 formed in one or more polymer layers 122.

Polymer layers 122 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, lamination, and the like.

Conductive features 120 (e.g., conductive lines 120A and/or vias 120B) may be formed in polymer layers 122 and electrically connect to dies 200 (e.g., through conductive pillars 210) and TIVs 114. The formation of conductive features 120 may include patterning polymer layers 122 (e.g., using a combination of photolithography and etching processes) and forming conductive features over and in the patterned polymer layer. For example, conductive features 120 may further include depositing a seed layer (not shown), using a mask layer (not shown) having various openings to define the shape of conductive features 120, and filling the openings in the mask layer using an electro-chemical plating process, for example. The mask layer and excess portions of the seed layer may then be removed. Thus, RDLs 118 are formed over dies 200 and molding compound 116. The number of polymer layers and conductive features of RDLs 118 is not limited to the illustrated embodiment of FIG. 6. For example, RDLs 118 may include any number of stacked, electrically connected conductive features in multiple polymer layers. Thus, a first package tier 100A is formed in a package wafer 100. Package tier 100A includes dies 200, TIVs 114, molding compound 116, and fan-out RDLs 118.

Figure 7:
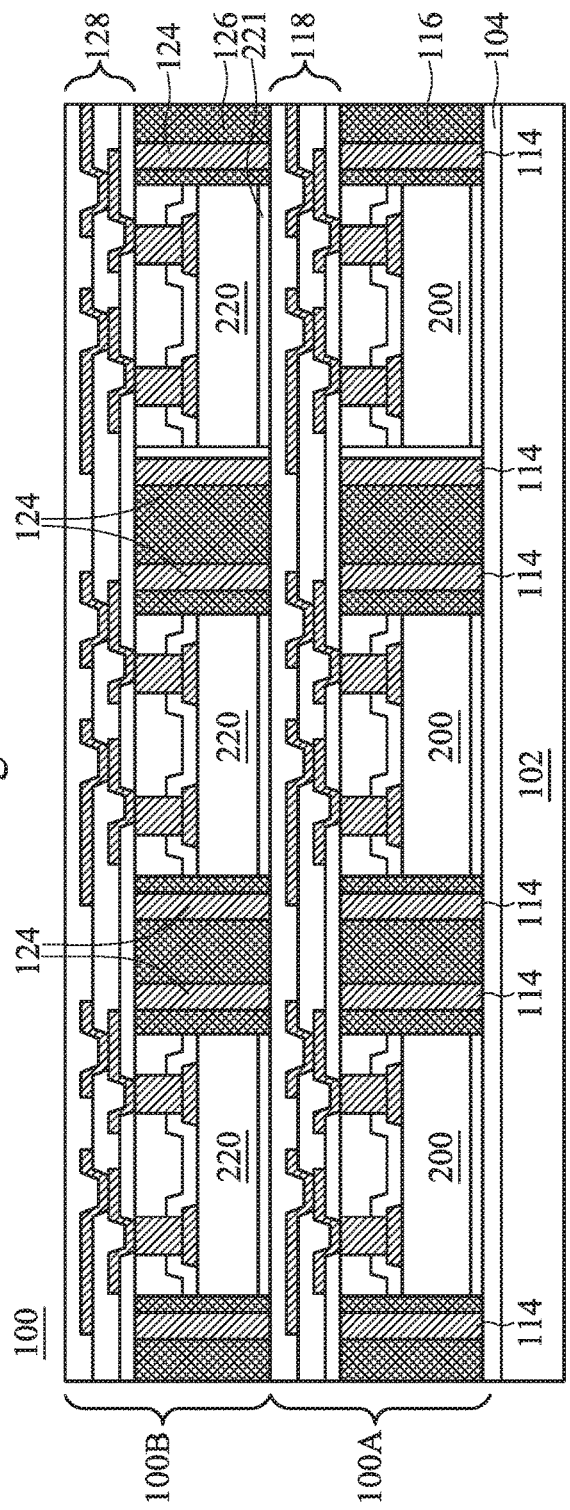

Next in FIG. 7, a second package tier 100B is formed over first package tier 100A in package wafer 100. Package tier 100B includes dies 220; TIVs 124 adjacent dies 220; molding compound 126 surrounding dies 220 and TIVs 124; and fan-out RDLs 128 formed over dies 220, TIVs 124, and molding compound 126. Dies 220, TIVs 124, molding compound 126, and RDLs 128 may be substantially similar to dies 200, TIVs 114, molding compound 116, and fan-out RDLs 118, respectively, and may be formed in a substantially similar way as discussed above. For example, TIVs 124 may be formed over RDLs 118 using a patterned photoresist (not illustrated) to define a shape of TIVs 124. Dies 220 may then be attached to a top surface of fan-out RDLs 118 between TIVs 124 using an adhesive layer 221. Dies 200 and 220 may perform a same or different functions. In any embodiment, dies 200 are dynamic random access memory (DRAM) dies whereas dies 220 are system on chip (SoC) dies although dies 200 and 200 may provide different functions in other embodiments. Subsequently, molding compound 126 is formed around dies 220 and TIVs 124, and RDLs 128 are formed over molding compound 126, TIVs 124, and dies 220. In some embodiments, additional device layers (not shown), comprising semiconductor dies, TIVs, and fan-out RDLs, for example, may optionally be formed over package tier 100B.

Figure 8:
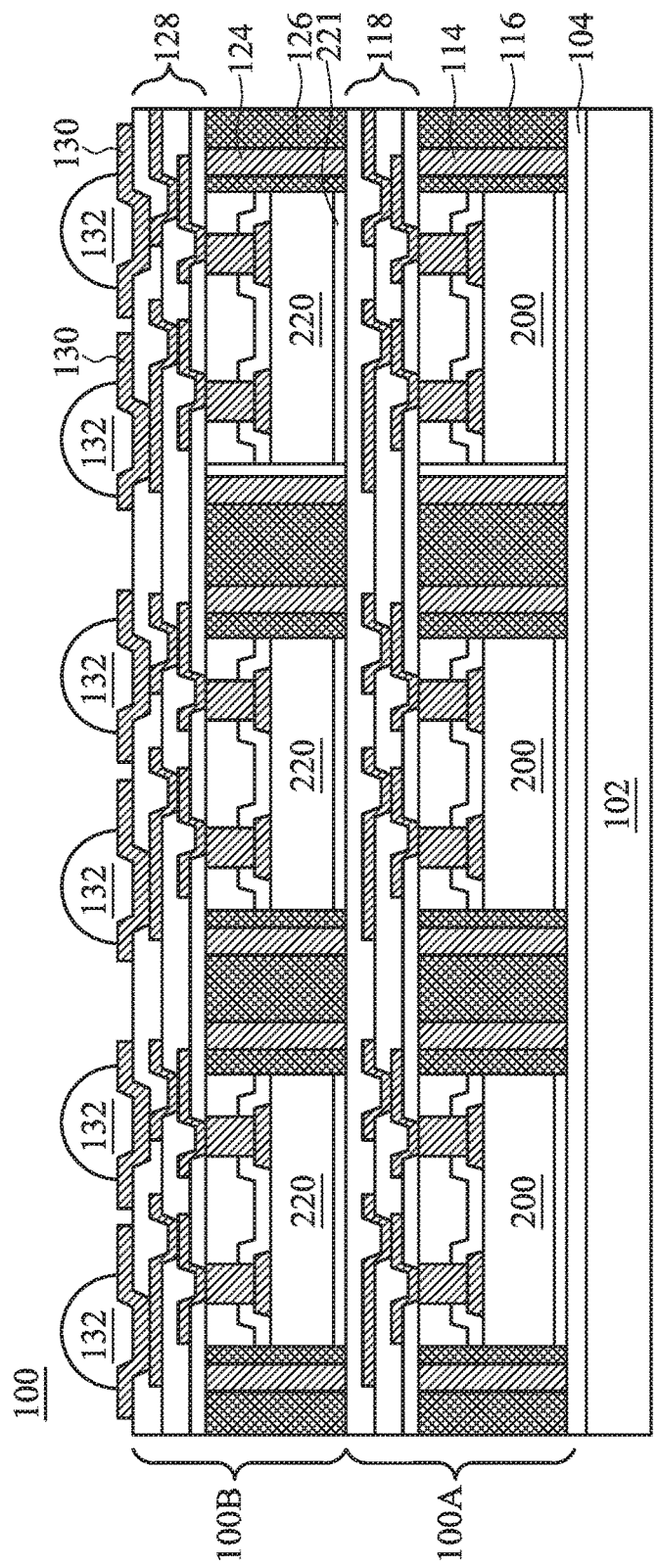

In FIG. 8, additional package features, such as external connectors 132 (e.g., BGA balls, C4 bumps, and the like) may be formed over RDLs 128. Connectors 132 may be disposed on UBMs 130, which may also be formed over RDLs 128. Connectors 132 may be electrically connected to dies 200 and 220 by way of RDLs 118 and/or RDLs 128. Connectors 132 may be used to electrically connect packages 180 (see FIG. 13A) to other package components such as another device die, interposers, package substrates, printed circuit boards, a mother board, and the like, and at least a subset of connectors 132 may be used to electrically connect TIVs 114 to ground. Other connectors 132 may be used to provide ground, power, and/or signal lines to dies 200 and 220.

Figure 9:
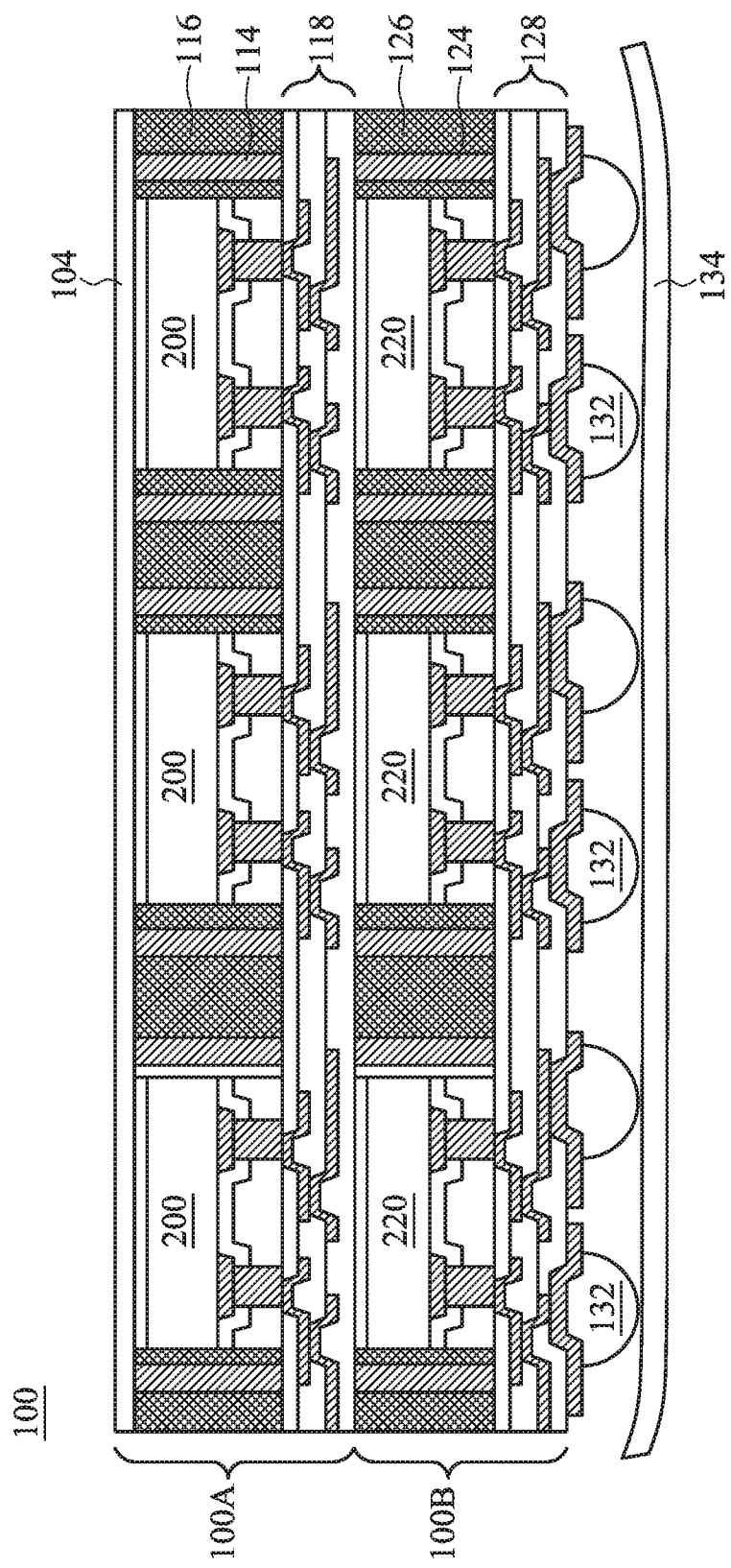
Figure 10:
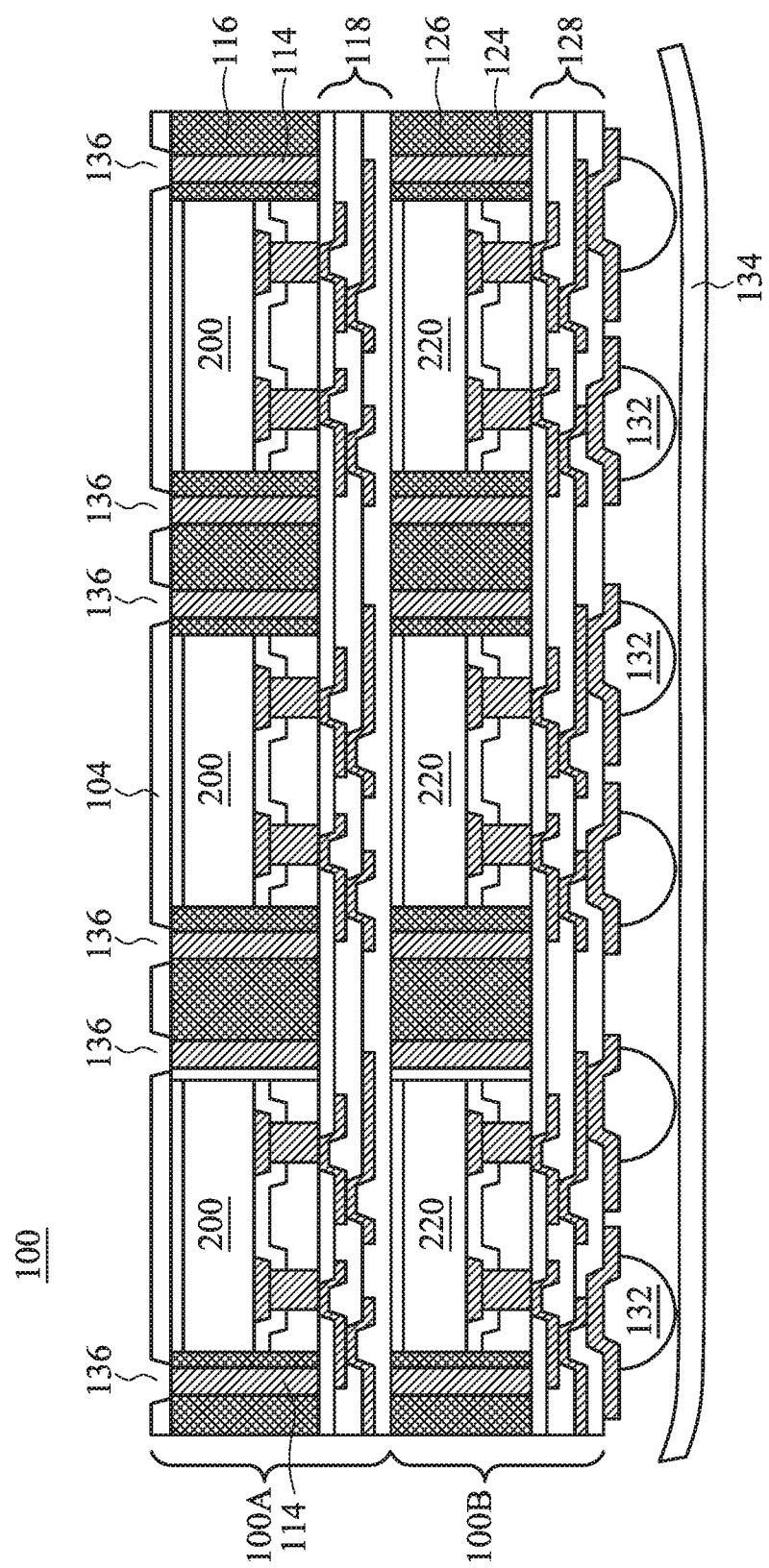
Figure 11:
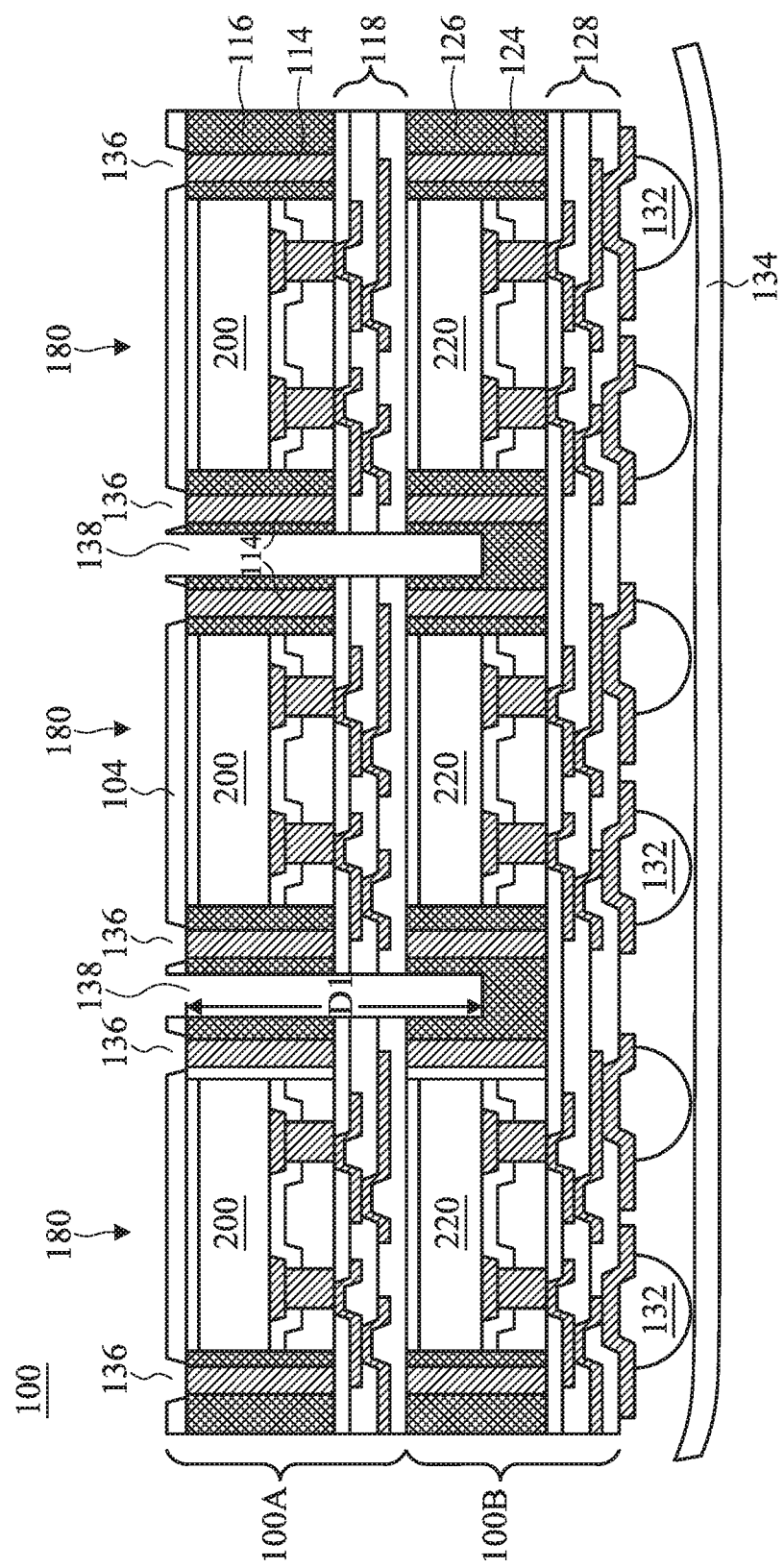

Subsequently, carrier substrate 102 may be removed as illustrated in FIG. 9. As further illustrated in FIG. 9, an orientation of device package may be reversed to expose polymer layer 104 for further processing. In the reversed orientation, connectors 132 may be attached to a temporary support frame 134 (e.g., comprising a support tape) for further processing. The further processing may include exposing TIVs 114 through polymer layer 104 as illustrated by FIG. 10. In an embodiment, TIVs 114 are exposed by laser etching openings 136 in polymer layer 104. As described above, TIVs 114 are electrically connected to connectors 132 by RDLs 118, TIVs 124, and RDLs 128. Thus, an electrical connection pathway extending through package wafer 100 is provided by exposing TIVs 114. Other methods for exposing TIVs 114 may also be used, such as, an etch back process or patterning polymer layer 104 prior to forming TIVs 114 as described in greater detail in subsequent paragraphs.

FIGS. 11 through 13A illustrate the formation of an EMI shield and package singulation. First, in FIG. 11, step cut process is performed (e.g., using a mechanical saw) to partially saw between individual packages 180 (including dies 200/220, corresponding portions of RDLs 118/128, UBMs 130, and connectors 132) in package wafer 100, for example, along scribe lines (not shown). The step cup process forms openings 138 extending between each package 180. In some embodiments, openings 138 only extend partially through the package wafer to a depth D1 of about 60 μm or less.

Figure 12:
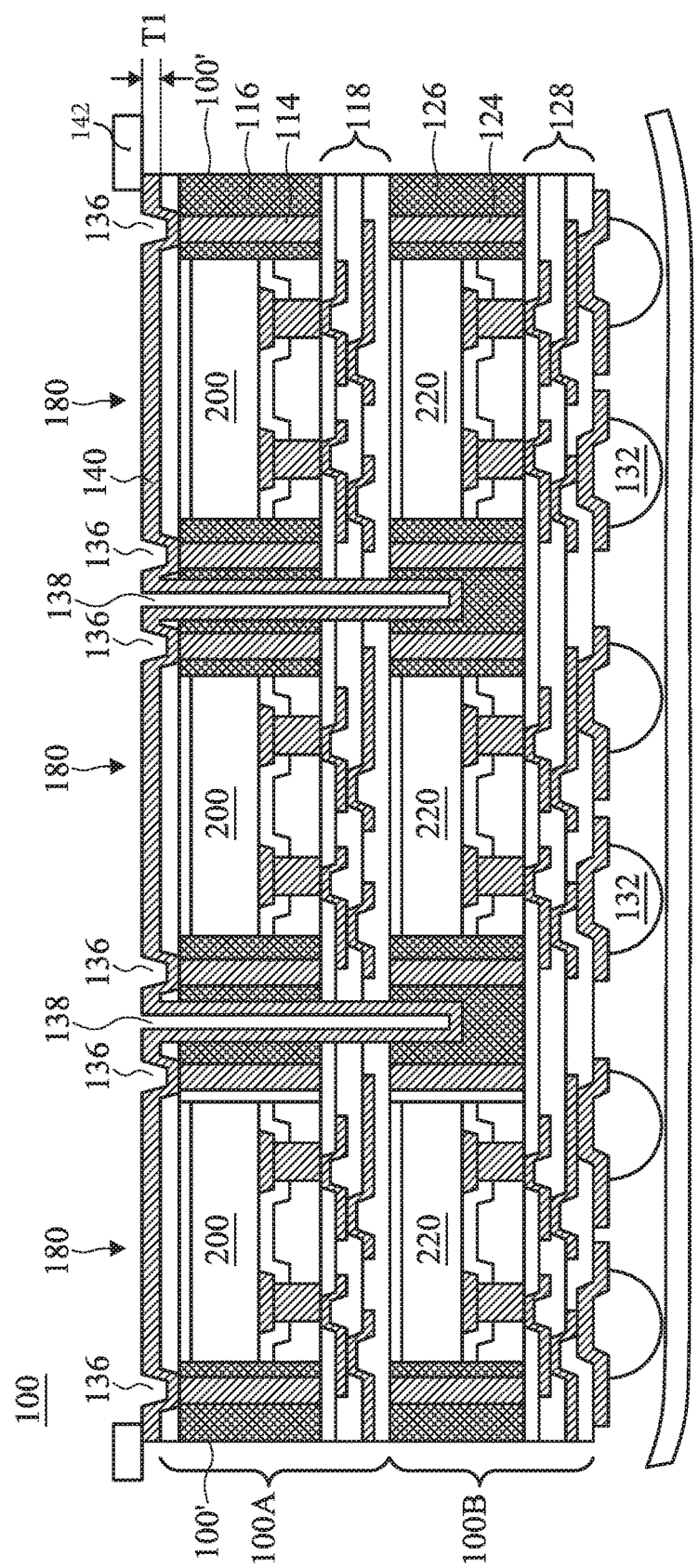

Next, in FIG. 12, EMI shield 140 is formed over a top surface of package wafer 100 using a conformal deposition process for example. In an embodiment, EMI shield 140 comprises a conductive material, such as, aluminum, copper, titanium, titanium nitride, tantalum, tantalum nitride, tungsten, a metallic alloy (e.g., stainless steel), alloys thereof, or combinations thereof, and may be deposited by any suitable process, such as electroless plating, sputtering, CVD, or the like. In some embodiments, EMI shield 140 has a thickness T1 of about 3 μm to about 10 μm although EMI shield 140 may have a different thickness in other embodiments. EMI shield 140 may be at least partially disposed in openings 136, extend through polymer layer 104, and contact TIVs 114. EMI shield 140 may further partially fill openings 138 between individual device packages 180. Thus, when the individual packages 180 are fully singulated (see FIG. 13A), EMI shield 140 may be disposed on exterior sidewalls of the singulated package 180. During formation of the EMI shield 140, scatter shields 142 may be disposed at peripheral regions of package wafer 100 to prevent (or reduce) damage to support frame 134. Thus, in some embodiments, EMI shield 140 may not be formed along exterior sidewalls 100' of the package wafer 100 prior to singulation. These packages 180 at the edge of the wafer without EMI shield 140 (sometimes referred to as ugly dies) may be subsequently discarded.

Subsequently, in FIG. 13A, individual packages 180 may be singulated along scribe lines (not shown) using a suitable die saw technique. For example, a die saw to cut through remaining portions of package wafer 100 exposed by openings 138 (see FIG. 11). After singulation, packages 180 are sorted and stored, for example, in a tray 144 until further processing (e.g., bonding packages 180 to another package component). In the completed package 100, various TIVs and RDLs (e.g., TIVs 114, RDLs 118, TIVs 124, and RDLs 128) in the package tiers (e.g., tiers 100A and 100B) provide an electrical grounding path through package 180 from external connectors 132 to EMI shield 140. Thus, by including TIVs in each package layer, EMI shield 140 may be grounded in package 180.

Figure 13A:
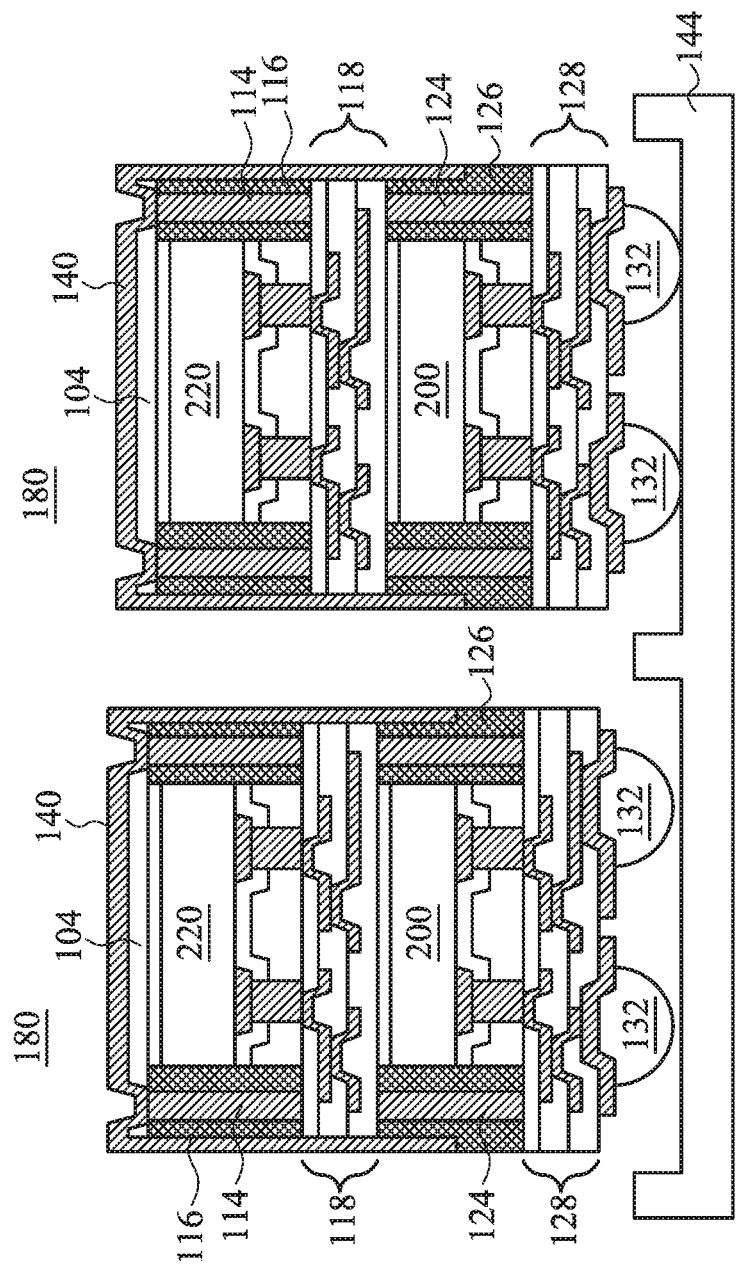

Furthermore, package 180 in FIG. 13A is singulated using two separate sawing processes. For example, a first die saw partially cuts through package wafer 100 (see FIG. 11), EMI shield 140 is formed over package wafer 100 (see FIG. 12), and a second die saw separates package 180 from other packages in the wafer (see FIG. 13A). In these embodiments, damage to external connectors 132 as a result of forming EMI shield 140 (e.g., backside scatter deposition) may be reduced due at least in part to the partial saw process, which exposes sidewalls of each individual package 100 without exposing connectors 132.

Figure 13B:
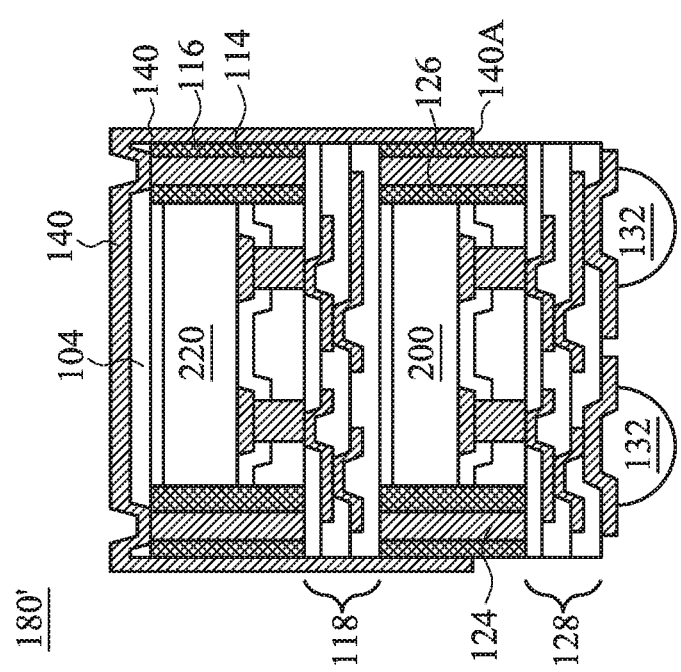

In another embodiment, packages 180 may be singulated using a single die saw process, which may advantageously decrease manufacturing costs. In such embodiments, openings 138 may extend through package wafer 100, and EMI shield 140 is subsequently formed on sidewalls and a top surface of packages 180 after singulation. FIG. 13B illustrates the resulting package 180'. As illustrated by FIG. 13B, EMI shield 140 includes a bottom surface 140A that extends past molding compound 116/126 and RDLs 118/128. In contrast, molding compound 116 and RDLs 128 extend under bottom surface 140A of EMI shield 140 in device package 180 of FIG. 13A.

Figure 14:
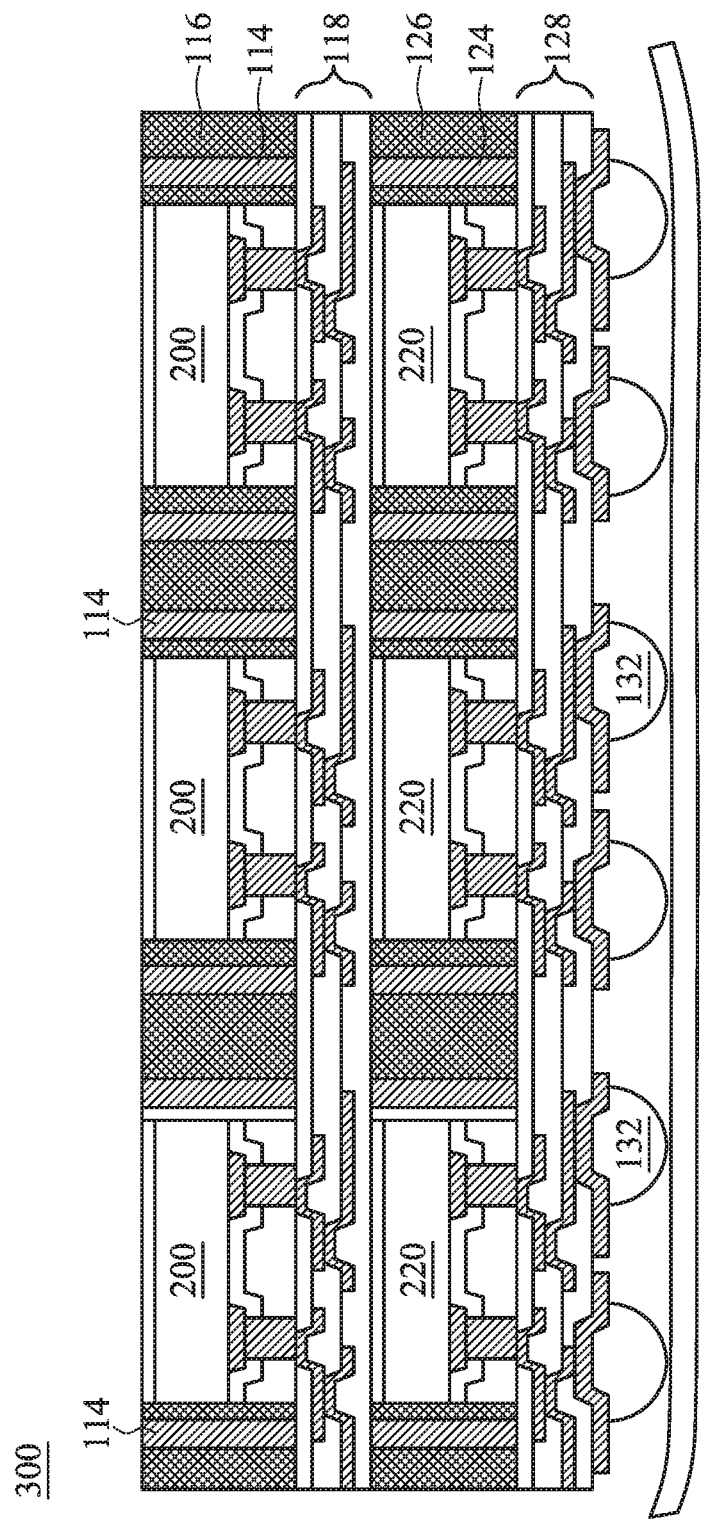
FIGS. 14 and 15 illustrate cross-sectional views of various intermediary stages of manufacturing a device package in accordance with some embodiments.
Figure 15:
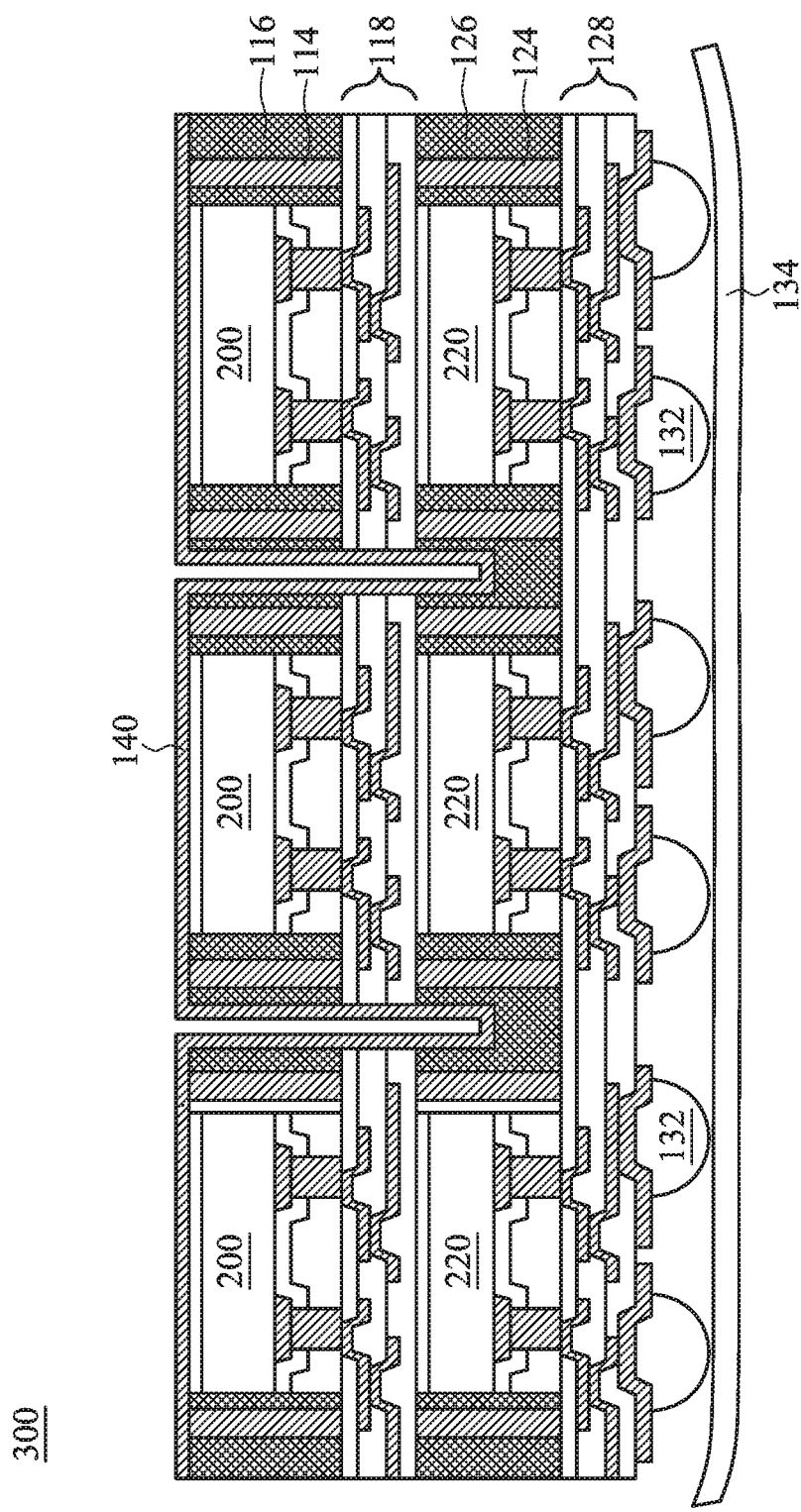

FIGS. 14 through 15 illustrate forming an EMI shield in a package wafer 300 according to another embodiment. Package wafer 300 may be substantially similar to package wafer 100 where like reference numerals indicate like elements. The process steps prior to the package of FIG. 14 may be substantially similar to those described above with respect to FIGS. 1 through 9. However, in contrast to using laser etching to expose TIVs 114, a suitable etch back technique may be used to remove polymer layer 104 (see FIG. 9) and expose TIVs 114 in the illustrated embodiment. Subsequently, as illustrated by FIG. 15, a die saw operation may be performed along scribe lines, and EMI shield 140 may be deposited on package wafer 300, for example. Because polymer layer 104 is removed, EMI shield 140 may be in contact with TIVs 114 as well as a top surface of molding compound 116. In such embodiments, a top surface of EMI shield 140 may be substantially level. Although FIG. 15 illustrates a two-step package saw process (e.g., similar to the process illustrated by FIGS. 11 through 13A), other embodiments may include a one-step package saw process (e.g., similar to FIG. 13B).

Figure 16:
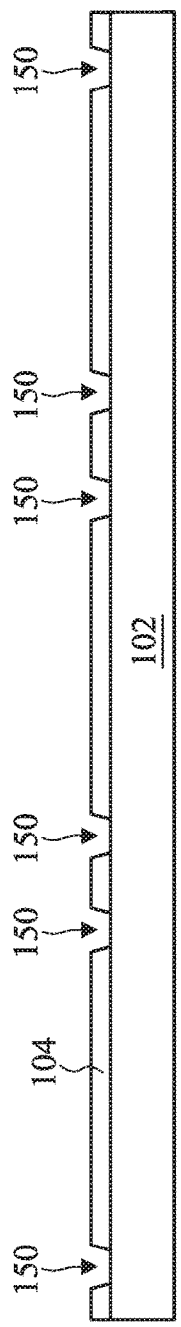
Figure 17:
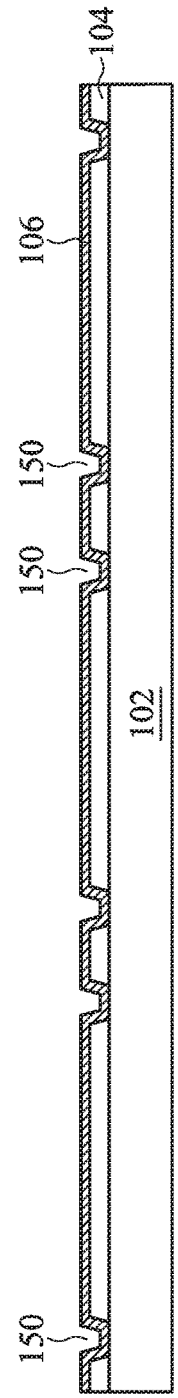

FIGS. 16 through 21 illustrate forming an EMI shield in a package 400 according to another embodiment. FIG. 16 illustrates a cross-sectional view of polymer layer 104 and carrier substrate 102 prior to forming any TIVs (e.g., TIVs 114). In FIG. 16, polymer layer 104 is patterned to include openings 150 using any suitable process, such as, photolithograph and/or etching. Openings 150 may be patterned prior to forming TIVs 114 or other portions of package 100 (e.g., attaching dies 200/220, forming molding compound 116/126, forming fan-out RDLs 118/128, or forming connectors 132). Next, in FIG. 17, seed layer 106 is formed over polymer layer 104 by sputtering, for example. Seed layer 106 may extend into openings 150 in polymer layer 104.

Figure 18:
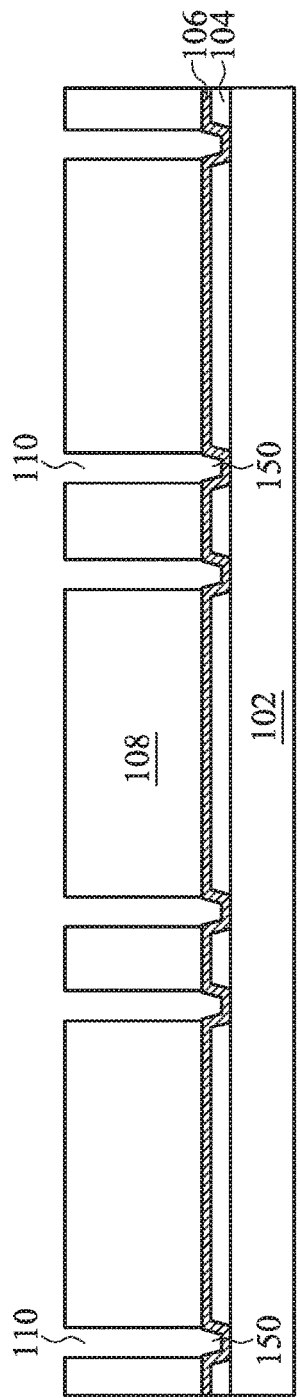

Subsequently in FIG. 18, patterned photoresist 108 is formed over seed layer 106. Photoresist 108 may be patterned to include openings 110 by photolithography as described above. Openings 110 may be aligned with openings 150 in polymer layer 104. Next, in FIG. 19, openings 110 and 150 may be filled with a conductive material 112 (e.g., in an electro-chemical plating process, electroless plating process, and the like). Subsequently, as illustrated in FIG. 20, photoresist 108 may be removed in an ashing and/or wet strip process, leaving TIVs 114 over carrier 102. Excess portions of seed layer 106 (e.g., portions of seed layer 106 not covered by TIVs 114) may also be removed using a combination of photolithograph and etching, for example. In the resulting structure, TIVs 114 extend through polymer layer 104.

Figure 21:
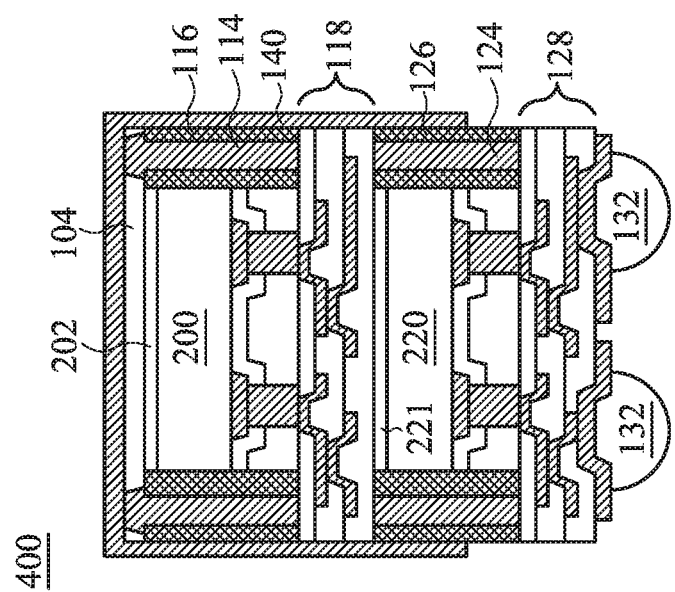

After TIVs 114 are formed, additional processing as described above with respect to FIGS. 4 through 13B may be performed. For example, package tiers (e.g., tiers 100A/100B) may be formed by attaching various device dies to carrier substrate 102, encapsulating the dies/TIVs in a molding compound, forming fan-out RDLs, forming external connectors, singulating various packages, and forming an EMI shield over a top surface and extending at least partially along sidewalls of the package. The resulting device package 400 is illustrated in FIG. 21. As illustrated, TIVs 114 extend through polymer layer 104 to electrically connect EMI shield 140. In the resulting package, a top surface of EMI shield 140 may be substantially level, and EMI shield 140 may be electrically connected to ground through TIVs 114, RDLs 118, TIVs 114, RDLs 128, and connectors 132.

Figure 22:
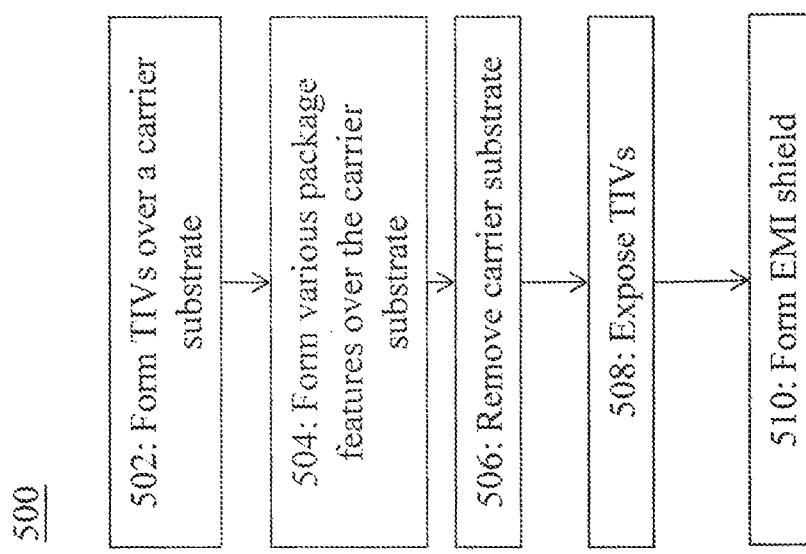
FIG. 22 illustrates a process flow for manufacturing a device package in accordance with some embodiments.

FIG. 22 illustrates a process flow 500 for forming a device package according to some embodiments. In step 502, TIVs (e.g., TIVs 114) are formed over a polymer layer (e.g., polymer layer 104) on a carrier substrate. In step 504, various package features (e.g., device dies 200/220, molding compound 116/126, TIVs 114/124, RDLs 118/128, external connectors 132) are also formed in the device package. In step 506, the carrier is removed and an orientation of the device package is flipped so that the polymer layer is exposed. In step 508, the TIVs are exposed through the polymer layer. Exposing the TIVs may include laser etching the polymer layer, removing the polymer layer (e.g., using an etch back process), or the like. In another embodiment, the polymer layer may be patterned prior to forming the TIVs, and the TIVs may be formed to extend through the polymer layer. In such embodiments, the TIVs may be exposed in step 506 (e.g., removing the carrier). In step 510, the package is singulated and an EMI shield (e.g., EMI shield 140) is formed over a top surface of the singulated package (e.g., either the fully singulated package or the partially singulated packaged). The EMI shield may be electrically connected to electrical ground by the TIVs, various RDLs, and the external connectors in the package.

Various embodiments include a package having device dies stacked in different package tiers. Fan-out RDLs are disposed between the dies and provide electrical connections between the dies. Conductive through inter-vias (TIVs) may also be disposed in each package tier, and a combination of the fan-out RDLs and the TIVs provide electrical connections from a first side of the device package (e.g., a side having external connectors such as solder balls) to an opposing side of the device package (e.g., a side having an EMI shield formed thereon). Thus, a grounded EMI shield may be formed in a multi-layered device package.

In accordance with an embodiment, a device package includes a device die, a molding compound surrounding the device die, a conductive through inter-via (TIV) extending through the molding compound, and an electromagnetic interference (EMI) shield disposed over and extending along sidewalls of the molding compound. The EMI shield contacts the conductive TIV, and the conductive TIV electrically connects the EMI shield to an external connector. The external connector and the EMI shield are disposed on opposing sides of the device die.

In accordance with another embodiment, a device package includes a first package tier including a first device die, a first molding compound extending along sidewalls of the first device die, and first conductive through inter-vias (TIVs) extending through the first molding compound. The device package also includes fan-out redistribution layers (RDLs) over the first package tier and a second package tier over the fan-out RDLs. The second package tier includes a second device die, a second molding compound extending along sidewalls of the second device die, and second conductive TIVs extending through the second molding compound. The device package also includes an electromagnetic interference (EMI) shield disposed over and extending along sidewalls of the second package tier, wherein the EMI shield contacts the second conductive TIVs. The first conductive TIVs, the fan-out RDLs, and the second conductive TIVs electrically connect the EMI shield to ground.

In accordance with yet another embodiment, a method for forming a device package includes forming conductive through inter-vias (TIVs) over a carrier substrate and attaching a device die to the carrier substrate. The device die is disposed between adjacent ones of the conductive TIVs. The method also includes forming a molding compound around the device die and the conductive TIVs, exposing the conductive TIVs, and forming an electromagnetic interference (EMI) shield over the device die and extending along sidewalls of the molding compound. The EMI shield contacts the conductive TIVs, and the conductive TIVs electrically connect the EMI shield to external connectors formed on an opposing side of first device die as the EMI shield.

In accordance with an embodiment, a package includes a first device die encapsulated in a first molding compound; a first through via extending through the first molding compound; a first redistribution layer electrically connected to the first device die and the first through via; and an electromagnetic interference (EMI) shield contacting the first through via. The first through via and the first redistribution layer electrically ground the EMI shield. The EMI shield includes a first region on a side of the first device die opposite the first redistribution layer; and a second region extending along the first molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
    a device die;
    a molding compound surrounding the device die;
    a conductive through inter-via (TIV) extending through the molding compound; and
    an electromagnetic interference (EMI) shield disposed over and extending along sidewalls of the molding compound, wherein the conductive TIV contacts the EMI shield and electrically connects the EMI shield to an external connector, and wherein the external connector and the EMI shield are disposed on opposing sides of the device die.

2. The device package of claim 1, wherein the external connector electrically connects the EMI shield to ground.

3. The device package of claim 1, further comprising a polymer layer disposed between the EMI shield and the device die, wherein the conductive TIV extends through the polymer layer.

4. The device package of claim 1, further comprising a polymer layer disposed between the EMI shield and the device die, wherein the EMI shield extends through the polymer layer.

5. The device package of claim 1, wherein the EMI shield contacts a top surface of the molding compound.

6. The device package of claim 1, wherein the EMI shield extends laterally past the molding compound.

7. A device package comprising:
    a first package tier comprising:
        a first device die;
        a first molding compound extending along sidewalls of the first device die; and
        first conductive through inter-vias (TIVs) extending through the first molding compound;
    first fan-out redistribution layers (RDLs) over the first package tier;
    a second package tier over the first fan-out RDLs, the second package tier comprising:
        a second device die;
        a second molding compound extending along sidewalls of the second device die; and
        second conductive TIVs extending through the second molding compound; and
    an electromagnetic interference (EMI) shield disposed over and extending along sidewalls of the second package tier, wherein the EMI shield contacts the second conductive TIVs, and wherein the first conductive TIVs, the first fan-out RDLs, and the second conductive TIVs electrically connect the EMI shield to ground.

8. The device package of claim 7, wherein the EMI shield further contacts a top surface of the second molding compound.

9. The device package of claim 7 further comprising a polymer layer over the second package tier, wherein the EMI shield extends through the polymer layer.

10. The device package of claim 7 further comprising a polymer layer over the second package tier, wherein second conductive TIVs extend through the polymer layer.

11. The device package of claim 7 further comprising:
    second RDLs under the first package tier; and
    external connectors under the second RDLs, wherein the second RDLs and the external connectors electrically connect the EMI shield to ground.

12. The device package of claim 7, wherein the EMI shield further extends along sidewalls of the first fan-out RDLs.

13. The device package of claim 7, wherein the EMI shield further extends along sidewalls of the first molding compound.

14. A package comprising:
    a first device die encapsulated in a first molding compound;
    a first through via extending through the first molding compound;
    a first redistribution layer electrically connected to the first device die and the first through via; and
    an electromagnetic interference (EMI) shield contacting the first through via, wherein the first through via and the first redistribution layer electrically ground the EMI shield, and wherein the EMI shield comprises:
- a first region on a side of the first device die opposite the first redistribution layer; and
- a second region extending along the first molding compound.

15. The package of claim 14 further comprising a polymer layer between the first molding compound and the first region of the EMI shield, wherein the first through via extends through the polymer layer.

16. The package of claim 14 further comprising a polymer layer between the first molding compound and the first region of the EMI shield, wherein the first region of the EMI shield extends through the polymer layer.

17. The package of claim 14 wherein the first region of the EMI shield contacts a surface of the first molding compound substantially level with a surface of the first through via.

18. The package of claim 14 further comprising:
- a second device die encapsulated in a second molding compound, wherein the first device die and the second device die are disposed on opposing sides of the first redistribution layer;
- a second through via extending through the second molding compound; and
- a second redistribution layer disposed on an opposing side of the second device die as the first redistribution layer, wherein the second through via and the second redistribution layer electrically ground the EMI shield.

19. The package of claim 18, wherein the second redistribution layer and the first redistribution layer are co-terminous.

20. The package of claim 18, wherein the second redistribution layer extends laterally past the first redistribution layer.

* * * * *